United States Patent
Mizuno

(10) Patent No.: US 10,120,283 B2
(45) Date of Patent: Nov. 6, 2018

(54) ILLUMINATION METHOD, ILLUMINATION OPTICAL DEVICE, AND EXPOSURE DEVICE

(75) Inventor: Yasushi Mizuno, Saitama (JP)

(73) Assignee: NIKON CORPORATION, Tokyo (JP)

( * ) Notice: Subject to any disclaimer, the term of this patent is extended or adjusted under 35 U.S.C. 154(b) by 16 days.

(21) Appl. No.: 14/123,876

(22) PCT Filed: Nov. 30, 2011

(86) PCT No.: PCT/JP2011/077730
§ 371 (c)(1),
(2), (4) Date: Mar. 27, 2014

(87) PCT Pub. No.: WO2012/169090
PCT Pub. Date: Dec. 13, 2012

(65) Prior Publication Data
US 2014/0218703 A1    Aug. 7, 2014

Related U.S. Application Data

(60) Provisional application No. 61/493,759, filed on Jun. 6, 2011.

(51) Int. Cl.
*G03B 27/54* (2006.01)
*G03F 7/20* (2006.01)

(52) U.S. Cl.
CPC .............. *G03F 7/20* (2013.01); *G03F 7/7085* (2013.01); *G03F 7/70116* (2013.01); *G03F 7/70133* (2013.01); *G03F 2007/2067* (2013.01)

(58) Field of Classification Search
CPC ......... G03F 7/70116; G03F 2007/2067; G03F 7/20; G03F 7/70133; G03F 7/7085
See application file for complete search history.

(56) References Cited

U.S. PATENT DOCUMENTS 5,312,513 A    5/1994   Florence et al.
6,611,316 B2   8/2003   Sewell
(Continued)

FOREIGN PATENT DOCUMENTS

EP    0 779 530 A1      6/1997
EP    1 420 298 A2      5/2004
WO    WO 01/35168 A1    5/2001

OTHER PUBLICATIONS

Jan. 31, 2012 International Search Report issued in International Patent Application No. PCT/JP2011/077730 (with English Translation).
(Continued)

*Primary Examiner* — Deoram Persaud
(74) *Attorney, Agent, or Firm* — Oliff PLC

(57) ABSTRACT

There is provided an illumination method for illuminating an illumination objective surface by using a light from a light source. The illumination method includes setting control amount for controlling a plurality of optical elements, to control a state of an incident light coming into each of the plurality of optical elements, the plurality of optical elements being arranged in parallel and being capable of controlling the state of the incident light; illuminating the illumination objective surface with the light from the light source via the plurality of optical elements; monitoring integrated energy of the light from the light source; and correcting the control amount for the plurality of optical elements on the basis of a result of the monitoring of the integrated energy.

36 Claims, 11 Drawing Sheets

(56) References Cited

U.S. PATENT DOCUMENTS

| | | | |
|---|---|---|---|
| 6,885,493 | B2 | 4/2005 | Ljungblad et al. |
| 6,891,655 | B2 | 5/2005 | Grebinski et al. |
| 6,900,915 | B2 | 5/2005 | Nanjyo et al. |
| 6,913,373 | B2 | 7/2005 | Tanaka et al. |
| 8,094,290 | B2 * | 1/2012 | Owa ................. G02B 26/0833 355/67 |
| 8,144,308 | B2 * | 3/2012 | Muramatsu ......... G03F 7/70116 355/67 |
| 8,379,187 | B2 * | 2/2013 | Tanitsu ............... G02B 27/0927 355/67 |
| 8,446,579 | B2 * | 5/2013 | Tanitsu ................ G01M 11/005 356/237.2 |
| 8,462,317 | B2 * | 6/2013 | Tanaka ................ G03F 7/70075 355/53 |
| 8,675,177 | B2 * | 3/2014 | Kudo .................... G03B 27/42 355/71 |
| 8,792,081 | B2 * | 7/2014 | Owa .................... G03F 7/70116 250/205 |
| 8,913,227 | B2 * | 12/2014 | Tanitsu ........................... 355/67 |
| 9,097,981 | B2 * | 8/2015 | Hirota ................ G03F 7/70116 |
| 9,140,990 | B2 * | 9/2015 | Tanitsu ................ G02B 27/286 356/364 |
| 9,140,993 | B2 * | 9/2015 | Shiraishi ................ G02B 27/28 |
| 9,146,474 | B2 * | 9/2015 | Kudo .................... G03F 7/70191 |
| 2003/0038225 | A1 | 2/2003 | Mulder et al. |
| 2005/0095749 | A1 | 5/2005 | Krellmann et al. |
| 2005/0140950 | A1 * | 6/2005 | Franken ................ G02B 7/008 355/53 |
| 2006/0170901 | A1 | 8/2006 | Tanitsu et al. |
| 2007/0146676 | A1 | 6/2007 | Tanitsu et al. |
| 2007/0242247 | A1 | 10/2007 | Shiraishi |
| 2009/0039292 | A1 * | 2/2009 | Lee ....................... G02B 13/143 250/492.2 |
| 2009/0097094 | A1 * | 4/2009 | Tanaka ................ G03F 7/70116 359/239 |
| 2009/0141760 | A1 * | 6/2009 | Saito .................... G11B 7/1263 372/38.02 |
| 2010/0141913 | A1 * | 6/2010 | Morimoto .............. G03B 27/52 355/52 |
| 2010/0149508 | A1 * | 6/2010 | Colina Santamaria ..................... G03B 27/54 355/67 |
| 2010/0253927 | A1 * | 10/2010 | Tanitsu ............... G02B 26/0808 355/67 |
| 2010/0316943 | A1 * | 12/2010 | Tanitsu ............... G02B 17/0892 430/30 |
| 2011/0181850 | A1 * | 7/2011 | Bach .................... G03F 7/70116 355/30 |
| 2011/0240611 | A1 * | 10/2011 | Sandstrom ........... B23K 26/032 219/121.61 |
| 2012/0293781 | A1 * | 11/2012 | Yoshihara ........... G03F 7/70883 355/30 |

OTHER PUBLICATIONS

Jan. 31, 2012 Written Opinion issued in International Patent Application No. PCT/JP2011/077730 (with English Translation).

* cited by examiner

Fig. 2
(A)
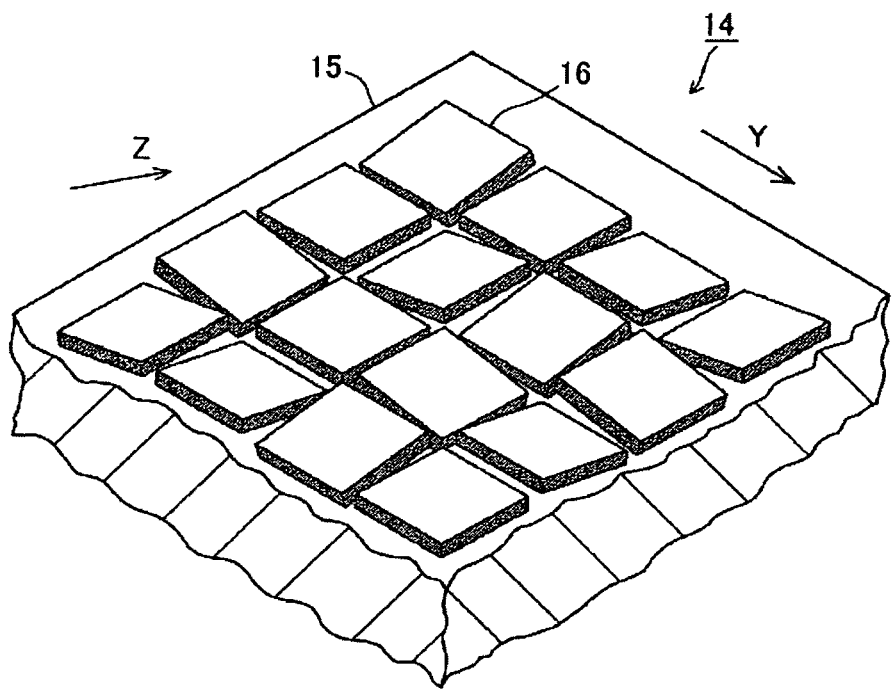
(B)
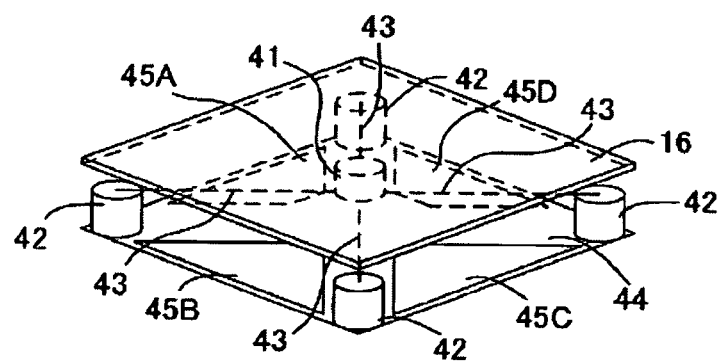

| Ei | BNF |
|---|---|
| Eth1 ~ Esat | BNForg |
| Eth2 ~ Eth1 | BNF1 |
| Eth3 ~ Eth2 | BNF2 |
| Eth4 ~ Eth3 | BNF3 |
| Eth5 ~ Eth4 | BNF4 |
| Eth6 ~ Eth5 | BNF5 |
| Eth7 ~ Eth6 | BNF6 |
| Eth8 ~ Eth7 | BNF7 |
| Eth9 ~ Eth8 | BNF8 |
| Eth10 ~ Eth9 | BNF9 |
| Eth11 ~ Eth10 | BNF10 |
| Eth12 ~ Eth11 | BNF11 |
| Eth13 ~ Eth12 | BNF12 |
| Eth14 ~ Eth13 | BNF13 |
| 0 ~ Eth14 | BNF14 |

F1 → Eth11 ~ Eth10, BNF10
B1 → Eth13 ~ Eth12, BNF12

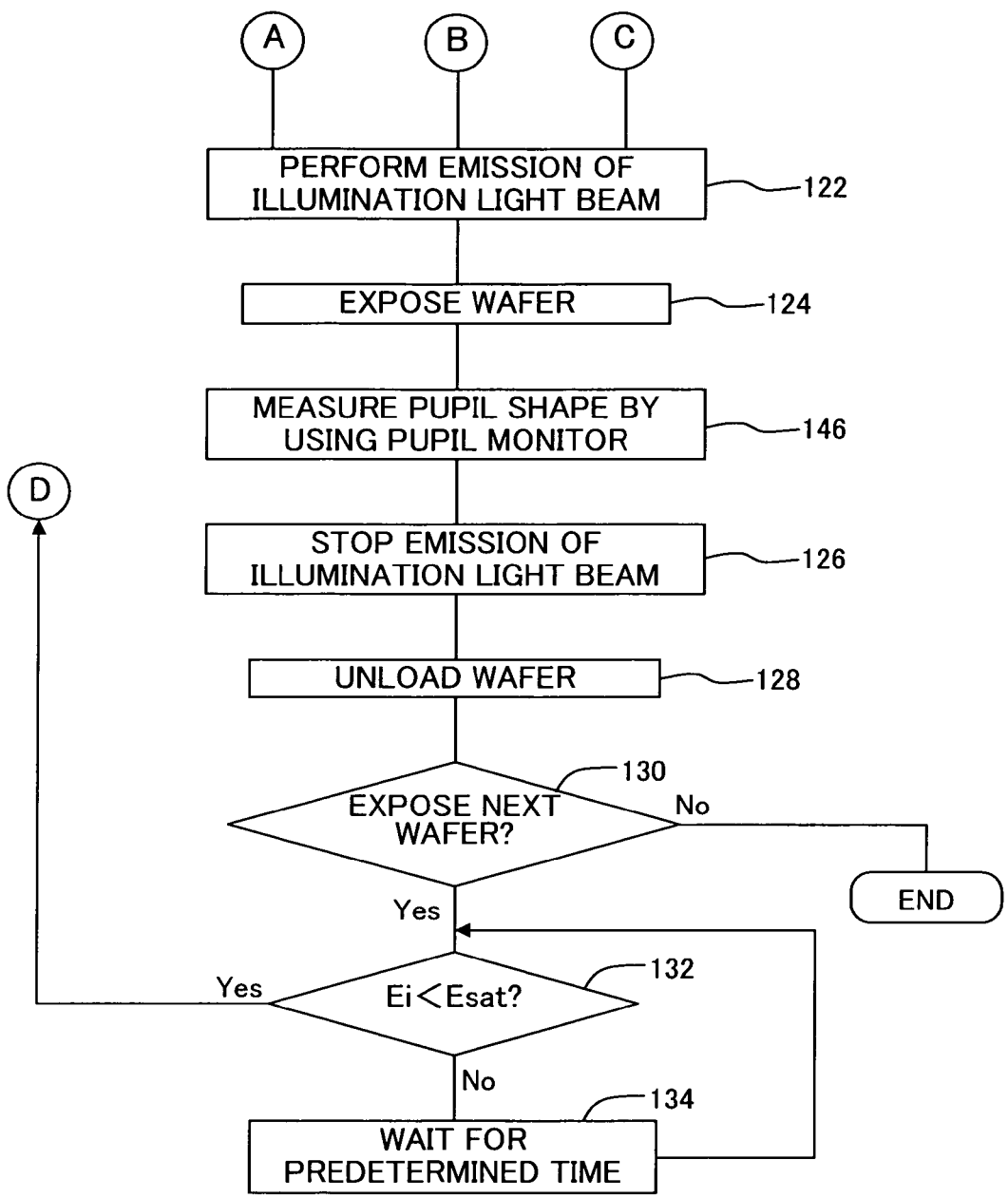
Fig. 11 (continued page)

ILLUMINATION METHOD, ILLUMINATION OPTICAL DEVICE, AND EXPOSURE DEVICE

CROSS-REFERENCE

This application is a U.S. national phase entry of International Application No. PCT/JP2011/077730 which was filed on Nov. 30, 2011 claiming the conventional priority of Provisional Patent Application No. 61/493,759, filed on Jun. 6, 2011 and the disclosure of Provisional Patent Application No. 61/493,759 is incorporated herein by reference in their entirety.

TECHNICAL FIELD

The present teaching relates to an illumination technique for illuminating an illumination objective surface, an exposure technique based on the use of the illumination technique, and a device producing technique based on the use of the exposure technique.

BACKGROUND ART

An exposure apparatus such as a stepper, a scanning stepper or the like, which is used, for example, in the lithography step in order to produce an electronic device (microdevice) such as a semiconductor element or the like, is provided with an illumination optical system for illuminating a reticle (mask) under various illumination conditions and at uniform illuminance distributions. The conventional illumination optical system has been provided with an intensity distribution setting optical system having a plurality of exchangeable diffractive optical elements in order that the light intensity distribution, which is provided on the pupil plane of the illumination optical system (plane conjugate with the exit pupil), is set to a distribution in which the intensity is increased, for example, in a circular area, an annular area, or a multipole area depending on the illumination condition.

Recently, an illumination optical apparatus which is provided with an intensity distribution setting optical system is also suggested. The intensity distribution setting optical system utilizes a spatial light modulator of the movable multi-mirror system having a large number of minute mirror elements with variable angles of inclination so that the shape of the light intensity distribution on the pupil plane of the illumination optical system (hereinafter referred to as "pupil shape") can be optimized to various distributions, depending on the pattern of the reticle (see, for example, U.S. patent application Publication No. 2003/0038225).

SUMMARY

It has been revealed that if the exposure is continued by using the illumination optical system having the conventional spatial light modulator, the pupil shape, which is set by the aid of the large number of mirror elements of the spatial light modulator, is gradually varied or fluctuated. This situation is considered to be caused by the change of the rigidity of the driving mechanism of each of the mirror elements of the spatial light modulator due to the radiation of the illumination light beam (exposure light beam) for the exposure to the mirror elements.

Taking the foregoing circumstances into consideration, an object of the present teaching is to suppress the fluctuation of the light intensity distribution when an illumination objective plane is illuminated by using a plurality of optical elements for which the state of incoming light can be controlled.

According to a first aspect of the present teaching, there is provided an illumination method for illuminating an illumination objective surface by using a light from a light source. The illumination method comprises setting control amount for controlling a plurality of optical elements, to control a state of an incident light coming into each of the plurality of optical elements, the plurality of optical elements being arranged in parallel and being capable of controlling the state of the incident light, illuminating the illumination objective surface with the light from the light source via the plurality of optical elements, monitoring integrated energy of the light from the light source, and correcting the control amount for the plurality of optical elements on the basis of a result of the monitoring of the integrated energy.

According to a second aspect of the present teaching, there is provided an illumination optical apparatus for illuminating an illumination objective surface by using a light from a light source. The illumination optical apparatus comprises a spatial light modulator which is arranged in an optical path for the light from the light source and which has a plurality of optical elements capable of controlling a state of an incident light coming into each of the plurality of optical elements, a monitor unit which monitors integrated energy of the light from the light source, and a control system which sets control amount for controlling the plurality of optical elements, to control the state of the incident light, and which corrects the control amount on the basis of the integrated energy monitored by the monitor unit.

According to a third aspect, there is provided an exposure apparatus for illuminating a pattern with an exposure light and exposing a substrate with the exposure light via the pattern and a projection optical system, the exposure apparatus comprising the illumination optical apparatus of the present teaching, wherein a light from the illumination optical apparatus is used as the exposure light.

According to a fourth aspect, there is provided a method for producing a device, comprising forming a pattern of a photosensitive layer on a substrate by using the exposure apparatus of the present teaching; and processing the substrate formed with the pattern.

BRIEF DESCRIPTION OF THE DRAWINGS

FIG. 2A shows an enlarged perspective view illustrating a part of a mirror element array of a spatial light modulator shown in FIG. 1, and FIG. 2B shows a perspective view illustrating a driving mechanism of one of the mirror elements shown in FIG. 2A.

DESCRIPTION OF THE EMBODIMENTS

First Embodiment

A first embodiment of the present teaching will be explained with reference to FIGS. 1 to 10.

Figure 1:
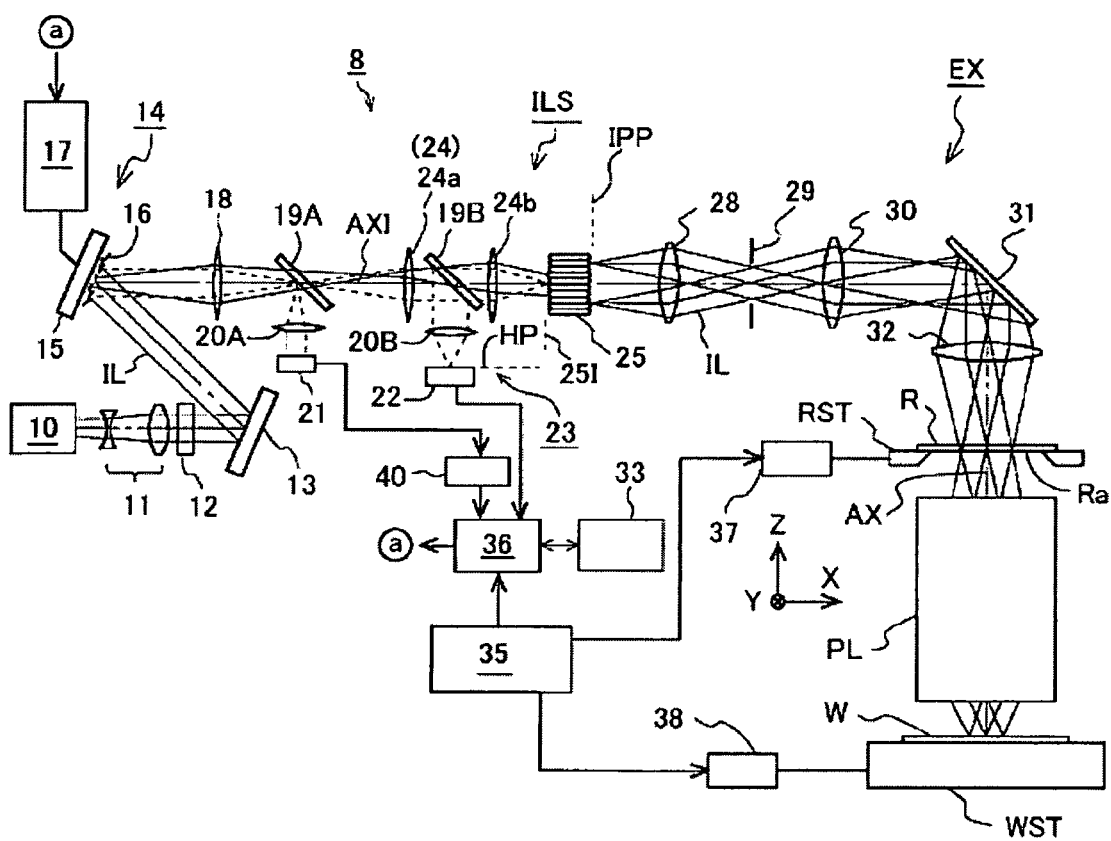
FIG. 1 shows a schematic arrangement of an exposure apparatus of a first embodiment.

FIG. 1 shows a schematic arrangement of an exposure apparatus EX according to this embodiment. The exposure apparatus EX is, for example, an exposure apparatus (projection exposure apparatus) of the scanning exposure type composed of a scanning stepper (scanner). With reference to FIG. 1, the exposure apparatus EX is provided with an illumination apparatus 8 which illuminates a reticle surface Ra as the pattern surface of a reticle R (mask) with the illumination light beam (exposure light beam) IL for the exposure. The illumination apparatus 8 is provided with a light source 10 which generates the illumination light beam IL, an illumination optical system ILS which illuminates the reticle surface Ra with the illumination light beam IL from the light source 10, an illumination control unit 36, and a storage device 33 which is connected to the illumination control unit 36. Further, the exposure apparatus EX is provided with, for example, a reticle stage RST which moves the reticle R, a projection optical system PL which projects an image of a pattern of the reticle R onto a surface of a wafer W (substrate), a wafer stage WST which moves the wafer W, a main control system 35 which is composed of a computer for controlling the operation of the entire apparatus as a whole, and various control systems.

The following explanation will be made below while setting the Z axis in parallel to the optical axis AX of the projection optical system PL, setting the X axis in the direction parallel to the paper surface of FIG. 1 in the plane perpendicular to the Z axis, and setting the Y axis in the direction perpendicular to the paper surface of FIG. 1. In this embodiment, the scanning direction for the reticle R and the wafer W during the exposure is the direction (Y direction) parallel to the Y axis. Further, the explanation will be made assuming that the directions of rotation (directions of inclination) about the axes parallel to the X axis, the Y axis, and the Z axis are designated as "θx direction", "θy direction", and "θz direction", respectively.

As for the light source 10, an ArF excimer laser light source, which pulse-emits, for example, a laser beam of linear polarization having a wavelength of 193 nm, is used. Those also usable as the light source 10 include, for example, a KrF excimer laser light source for supplying a laser beam having a wavelength of 248 nm and a high harmonic wave generator for generating a high harmonic wave of a laser beam outputted from a solid laser light source (for example, YAG laser and semiconductor laser).

With reference to FIG. 1, the illumination light beam IL of linear polarization, which is composed of the laser beam emitted from the light source 10 controlled by an unillustrated power source unit, passes through a transmitting optical system including a beam expander 11, a polarizing optical system 12 for adjusting the polarization direction and the polarization state, and a mirror 13 for bending or folding the optical path, and the illumination light beam IL obliquely comes, at predetermined small angles of incidence, into reflecting surfaces of a large number of minute mirror elements 16 having angles of inclination variable about two orthogonal axes of a spatial light modulator (SLM) 14 respectively. The spatial light modulator 14 (hereinafter referred to as "SLM 14") has an array of the large number of mirror elements 16 and a driving substrate unit 15 for supporting and driving the respective mirror elements 16. The angles of inclination of the respective mirror elements 16 are controlled by an SLM control system 17.

FIG. 2A shows an enlarged perspective view illustrating a part of SLM 14. In FIG. 2A, the array of the large number of mirror elements 16 arranged adjacently at constant pitches approximately in the Y direction and the Z direction is supported on the surface of the driving substrate unit 15 of SLM 14.

As shown in FIG. 2B, the driving mechanism of one mirror element 16 is provided with, for example, hinge members 43 which support the mirror element 16 by the aid of a support column 41, a support substrate 44, four column members 42 which support the hinge members 43 on the support substrate 44, and four electrodes 45A, 45B, 45C, 45D which are formed on the support substrate 44. In this exemplary construction, the support column 41, which is flexibly supported by the aid of the hinge members 43, can be allowed to swing and incline by controlling the electrostatic force acting between the electrodes by controlling the difference in electric potential between the back surface of the mirror element 16 and the electrodes 45A to 45D. Accordingly, the angles of inclination about the orthogonal two axes of the reflecting surface of the mirror element 16 fixedly provided on the support column 41 can be continuously controlled within a predetermined variable range.

Those usable as the spatial light modulator as described above include, for example, those disclosed, for example, in European Patent Publication No. 779530 and U.S. Pat. No. 6,900,915. The mirror element 16 is the substantially square plane mirror. However, the shape thereof may be any shape including, for example, rectangular shapes.

With reference to FIG. 1, SLM 14 forms a predetermined light intensity distribution, according to a illumination condition, on an incident surface (incoming surface) 25I of a fly's eye lens 25 described later on via the large number of mirror elements 16. For example, when the annular illumination is performed, SLM 14 reflects the illumination light beam IL to form a light intensity distribution in which the intensity is increased in an annular area on the incident surface 25I. During the ordinary illumination, a light intensity distribution, in which the intensity is increased in a circular area, is formed. During the dipole illumination or the four-pole or four-spot (quadruple) illumination, a light intensity distribution, in which the intensity is increased at two positions or four positions, is formed. The main control system 35 supplies the information of the illumination condition to the illumination control unit 36, and accordingly, the illumination control unit 36 controls the operation of SLM 14 by the aid of the SLM control system 17.

The illumination light beam IL, which is reflected by the large number of mirror elements 16 of SLM 14, comes into an incoming optical system 18 which converts the illumination light beam IL into the parallel light beam, along the optical axis AX1 of the illumination optical system ILS. The incoming optical system 18 also functions such that the light intensity distribution, which is formed on the incident surface 25I, is formed on the plane between the incident surface 25I and the incoming optical system 18. A part of the illumination light beam IL allowed to pass through the incoming optical system 18 is reflected by a beam splitter 19A, and the reflected (separated) light beam comes into an integrator sensor 21 composed of a photoelectric sensor via a light-collecting lens 20A. The detection signal of the integrator sensor 21 is supplied to an integrating unit 40 as a part of the illumination apparatus 8. As described later on, the integrating unit 40 calculates the integrated energy obtained by integrating the illumination energy of the illumination light beam IL by using the detection signal of the integrator sensor 21, and the calculation result is outputted to the illumination control unit 36, if necessary. The beam splitter 19A, which is provided to supply the light beam separated from the illumination light beam IL to the integrator sensor 21, can be installed at any position on the illumination optical path.

The illumination light beam IL, which passes through the beam splitter 19A, comes into the incident surface 25I of the fly's eye lens 25 via a relay optical system 24 composed of a first lens system 24a and a second lens system 24b. The fly's eye lens 25 has a large number of lens elements arranged to make substantial tight contact with each other in the Z direction and the Y direction. The exit surface (outgoing surface) of the fly's eye lens 25 serves as the pupil plane IPP (plane conjugate with the exit pupil) of the illumination optical system ILS (hereinafter referred to as "illumination pupil plane"). A surface light source, which is composed of a large number of secondary light sources (light source images), is formed by the wavefront division on the exit surface of the fly's eye lens 25 (illumination pupil plane IPP).

The fly's eye lens 25 includes a large number of optical systems arranged in parallel. Therefore, the macroscopic light intensity distribution, which is provided on the incident surface 25I, is transmitted as it is to the illumination pupil plane IPP as the exit surface. In other words, the macroscopic light intensity distribution, which is formed on the incident surface 25I, exhibits the high correlation with respect to the macroscopic light intensity distribution of the entire secondary light source. In this context, the incident surface 25I is the plane equivalent to the illumination pupil plane IPP. Any shape of light intensity distribution of the illumination light beam IL formed on the incident surface 25I (shape of the area surrounded by the contour line within which the light intensity is at a predetermined level) is the pupil shape which is the shape of the light intensity distribution on the illumination pupil plane IPP as it is. A microlens array may be used in place of the fly's eye lens 25. For example, a cylindrical micro-fly's eye lens disclosed in U.S. Pat. No. 6,913,373 may be used as the fly's eye lens.

Further, a beam splitter 19B is installed between a first lens 24a and a second lens 24b. The light beam, which is branched from the illumination light beam IL by the beam splitter 19B, comes into a light-receiving surface of a two-dimensional image pickup device 22 of the CMOS type or CCD via a light-collecting lens 20B. The detection surface HP, on which the light-receiving surface of the image pickup device 22 is arranged, is set to be conjugate with the incident surface 25I of the fly's eye lens 25 by the light-collecting lens 20B. In other words, the detection surface HP is also the plane equivalent to the illumination pupil plane IPP. A pupil monitor system 23 is constructed including the beam splitter 19B, the light-collecting lens 20B, and the image pickup device 22.

It is possible to measure the light intensity distribution of the incident surface 25I, and consequently the shape (pupil shape) of the light intensity distribution on the illumination pupil plane IPP by processing the image pickup signal of the image pickup device 22 using an internal processing circuit. The information of the measured pupil shape is supplied to the illumination control unit 36, if necessary.

The detection surface HP may be a plane disposed in the vicinity of the plane conjugate with the incident surface 25I. The plane disposed in the vicinity of the plane conjugate with the incident surface 25I is, for example, a plane positioned in the space between the optical member having the refractive power and being arranged on the incoming side of the plane conjugate with the incident surface 25I (in FIG. 1, it is the light-collecting lens 20B) and the optical member having the refractive power on the exit side (in FIG. 1, it is, for example, virtual optical member positioned at the position symmetrical with the light-collecting lens 20B with respect to the conjugate plane).

The illumination light beam IL from the surface light source formed on the illumination pupil plane IPP illuminates an illumination area of the reticle surface Ra with a uniform illuminance distribution, via a first relay lens 28, a reticle blind (field diaphragm) 29, a second relay lens 30, an optical path bending mirror 31, and a condenser optical system 32. The illumination optical system ILS is constructed including the optical members ranging from the beam expander 11 to SLM 14, the incoming optical system 18, the beam splitter 19A, the light-collecting lens 20A, the integrator sensor 21, the relay optical system 24, the pupil monitor system 23, and the optical system ranging from the fly's eye lens 25 to the condenser optical system 32. The respective optical members of the illumination optical system ILS are supported by an unillustrated frame.

The pattern in the illumination area of the reticle R is projected onto the exposure area of one shot area of the wafer W at a predetermined projection magnification (for example, ¼ or ⅕) via the projection optical system PL which is telecentric on the both sides (or on one side on the wafer side) with the illumination light beam IL allowed to come from the illumination optical system ILS. The illumination pupil plane IPP is conjugate with the pupil plane of the projection optical system PL (plane conjugate with the exit pupil). The wafer W includes such a material or member that the surface of a base material such as silicon or the like is coated with a photoresist (photosensitive material) of a predetermined thickness.

The reticle R is sucked and held (retained) on the upper surface of the reticle stage RST. The reticle stage RST is placed on the upper surface of an unillustrated reticle base (surface parallel to the XY plane) so that the reticle stage RST is movable at a constant velocity in the Y direction and the reticle stage RST is movable at least in the X direction, the Y direction, and the θz direction. The two-dimensional position of the reticle stage RST is measured by an unillustrated laser interferometer. On the basis of the measurement information, the main control system 35 controls the position and the velocity of the reticle stage RST by the aid of a driving system 37 including a linear motor or the like.

The wafer W is sucked and held (retained) on the upper surface of the wafer stage WST by the aid of a wafer holder (not shown). The wafer stage WST is movable in the X direction and the Y direction on the upper surface of an unillustrated wafer base (surface parallel to the XY plane), and the wafer stage WST is movable at a constant velocity in the Y direction. The two-dimensional position of the wafer stage WST is measured by an unillustrated laser interferometer. On the basis of the measurement information, the main control system 35 controls the position and the velocity of the wafer stage WST by the aid of a driving system 38 including a linear motor or the like. An alignment system (not shown) is also provided in order to perform the alignment for the reticle R and the wafer W.

Figure 3:
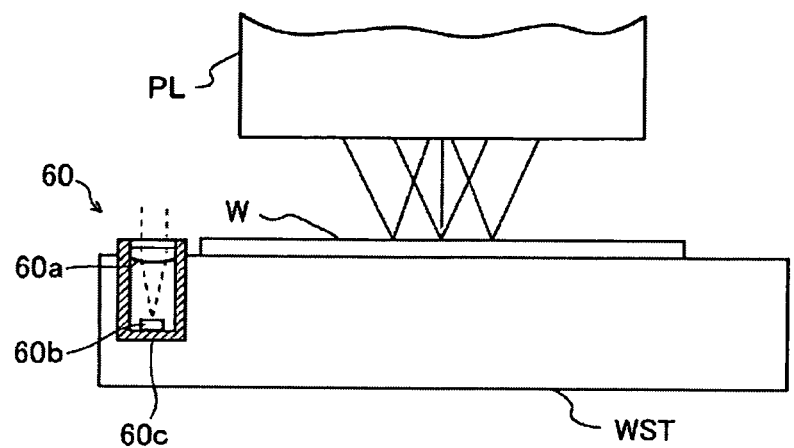
FIG. 3 shows, with partial cutout, a pupil monitor of a modified embodiment.
Figure 4:
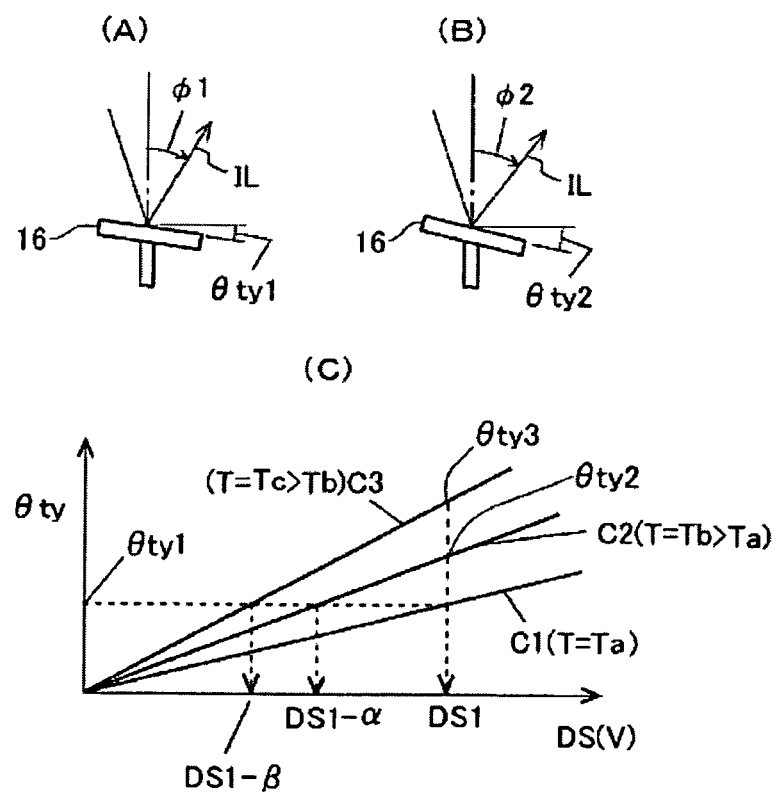
FIG. 4A shows an enlarged view illustrating the mirror element when the temperature is low.
FIG. 4B shows an enlarged view illustrating the mirror element when the temperature is high.
FIG. 4C shows a relationship among the temperature of the mirror element, the driving signal, and the angle of inclination.
Figure 5:
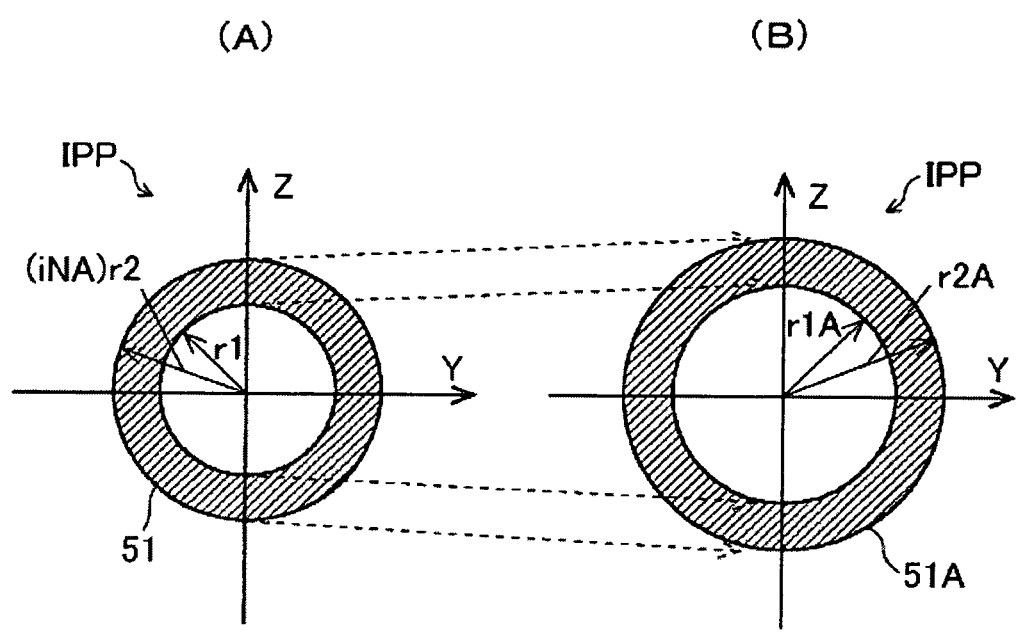
FIG. 5A shows a pupil shape when the temperature of the mirror element is low.
FIG. 5B shows a pupil shape when the temperature of the mirror element is high.

A monitor device, which is provided on the wafer stage WST, may be used in place of the pupil monitor system 23 or in addition to the pupil monitor system 23. As shown in FIG. 3, for example, the monitor device is a pupil monitor 60 having a case 60c which is fixed to the wafer stage WST, and a light-collecting lens 60a and a two-dimensional image pickup device 60b of the CMOS type or CCD which are supported in this order from the side of the projection optical system PL in the case 60c. The light-receiving surface of the image pickup device 60b is arranged on the focal plane of the light-collecting lens 60a. When the pupil monitor 60 is moved into the exposure area of the projection optical system PL, the light-receiving surface of the image pickup device 60b is conjugate (or may be approximately conjugate) with the illumination pupil plane IPP shown in FIG. 1. The pupil shape can be measured by processing the image pickup signal of the image pickup device 60b in this state. The information of the measured pupil shape is supplied to the illumination control unit 36 shown in FIG. 1. A detachable pupil monitor, which is provided on the wafer stage WST or the reticle stage RST, can be also used in place of the pupil monitor 60 fixed to the wafer stage WST.

During the exposure for the wafer W performed by the exposure apparatus EX, the main control system 35 selects the illumination condition (pupil shape) depending on the pattern of the reticle R, and the main control system 35 sets the selected illumination condition to the illumination control unit 36. The illumination control unit 36 individually controls the angles of inclination of the respective mirror elements 16 of SLM 14 about the two axes by the aid of the SLM control system 17 depending on the illumination condition. Subsequently, the wafer W is moved to the scanning start position in accordance with the movement (step movement) of the wafer stage WST. After that, the light emission of the light source 10 is started, and the wafer W is exposed with the image of the pattern of the reticle R formed by the projection optical system PL, while the reticle R and the wafer W are synchronously moved by using the projection magnification as the velocity ratio by the aid of the reticle stage RST and the wafer stage WST. Thus, one shot area of the wafer W is subjected to the scanning exposure with the image of the pattern of the reticle R. By the step-and-scan operation in which the step movement and the scanning exposure are repeated for the wafer W as described above, all of the shot areas of the wafer W are exposed with the image of the pattern of the reticle R. In this procedure, the scanning direction can be the X direction shown in FIG. 1.

The following fact has been revealed. That is, when the exposure is progressively continued as described above, the light intensity distribution formed on the incident surface 25I of the fly's eye lens 25 via the large number of mirror elements 16 of SLM 14, and consequently the pupil shape formed on the illumination pupil plane IPP are gradually varied or fluctuated. The factor of the fluctuation will be explained with reference to FIGS. 4A to 4C and FIGS. 5A and 5B.

At first, it is assumed that the target pupil shape on the illumination pupil plane IPP is the shape of an annular area 51 having an inner radius r1 and an outer radius r2 (area in which the light intensity is not less than a predetermined level) as shown in FIG. 5A. On this assumption, it is assumed that $\theta ty1$ represents the angle of inclination of a certain mirror element 16 of SLM 14 about the first axis of the orthogonal two axes immediately after the start of the exposure, and $\phi 1$ represents the angle of reflection of the illumination light beam IL reflected by the mirror element 16. When the exposure is continued thereafter, then the temperatures of the mirror element 16 and the driving mechanism thereof are gradually raised by the radiation energy of the illumination light beam IL, and the rigidity of the driving mechanism (especially the hinge member 43 shown in FIG. 2B) is lowered. Therefore, when the driving signal (voltage) for driving the mirror element 16 remains the same, as shown in FIG. 4B, the angle of inclination $\theta ty2$ of the mirror element 16 is larger than $\theta ty1$, and the angle of reflection $\phi 2$ of the illumination light beam IL is larger than $\phi 1$. Similarly, due to the rise of the temperature of the mirror element 16, the angle of inclination of the mirror element 16 about the second axis of the orthogonal two axes is also gradually increased, and the angle of reflection of the reflected light beam is also increased.

As a result, as shown in FIG. 5B, the pupil shape becomes an annular area 51A in which an inner radius r1A and an outer radius r2A are larger than the previous radii r1, r2 respectively. Therefore, it is understood that, in the case of the exposure is continued, if the driving signal of the mirror element 16 is set to an constant value, then the temperatures of the mirror element 16 and the driving mechanism thereof are raised, and the pupil shape gradually becomes larger.

In this situation, the relationship between the driving signal DS (voltage (V)) of the mirror element 16 and the angle of inclination $\theta ty$ about the first axis is as shown by a straight line C1 shown in FIG. 4C when the temperature T of the mirror element 16 (hereinafter referred to as "mirror temperature T") is the initial value Ta which is the value before the temperature T is raised. As the mirror temperature T is raised to Tb, Tc, the relationship between the driving signal DS and the angle of inclination $\theta ty$ is represented by lines with larger inclinations such as straight lines C2, C3. Therefore, assuming that the driving signal DS is set to DS1 (angle of inclination is $\theta ty1$) along the straight line C1 when the mirror temperature T is Ta, if the mirror temperature T is raised to Tb, Tc, then the angle of the mirror element 16 is increased to $\theta ty2$, $\theta ty3$. Therefore, in order to maintain the angle of inclination of the mirror element 16 to the initial angle of inclination $\theta ty1$, it is appropriate that the driving signal DS is decreased to (DS1−$\alpha$) and (DS1−$\beta$) ($\beta$>$\alpha$) respectively along the straight lines C2, C3 when the temperatures are Tb, Tc. That is, it is possible to suppress the fluctuation of the angle of inclination of the mirror element 16 by decreasing the driving signal DS depending on the increase in the mirror temperature T.

The integrated energy of the illumination light beam IL measured by using the integrator sensor 21 indirectly corresponds to the average temperature of all of the mirror elements 16 of SLM 14. Accordingly, in this embodiment, in order to suppress the fluctuation of the pupil shape during the exposure, the driving signal for each of the mirror elements 16 of SLM 14 is corrected on the basis of the measured value of the integrated energy of the illumination light beam IL during the exposure.

At first, an explanation will be made, with reference to a flow chart shown in FIG. 6, about an example of the method for determining the integrated energy Ei of the illumination light beam IL from the detection signal of the integrator sensor 21 by the integrating unit 40 shown in FIG. 1. In this procedure, a first calculating unit included in the integrating unit 40 calculates the integrated value ΣP by continuously integrating the values each of which is obtained by multiplying the detection signal outputted from the integrator sensor 21 by a predetermined coefficient (for example, coefficient to determine the radiation energy on the surface of the wafer W).

Figure 6:
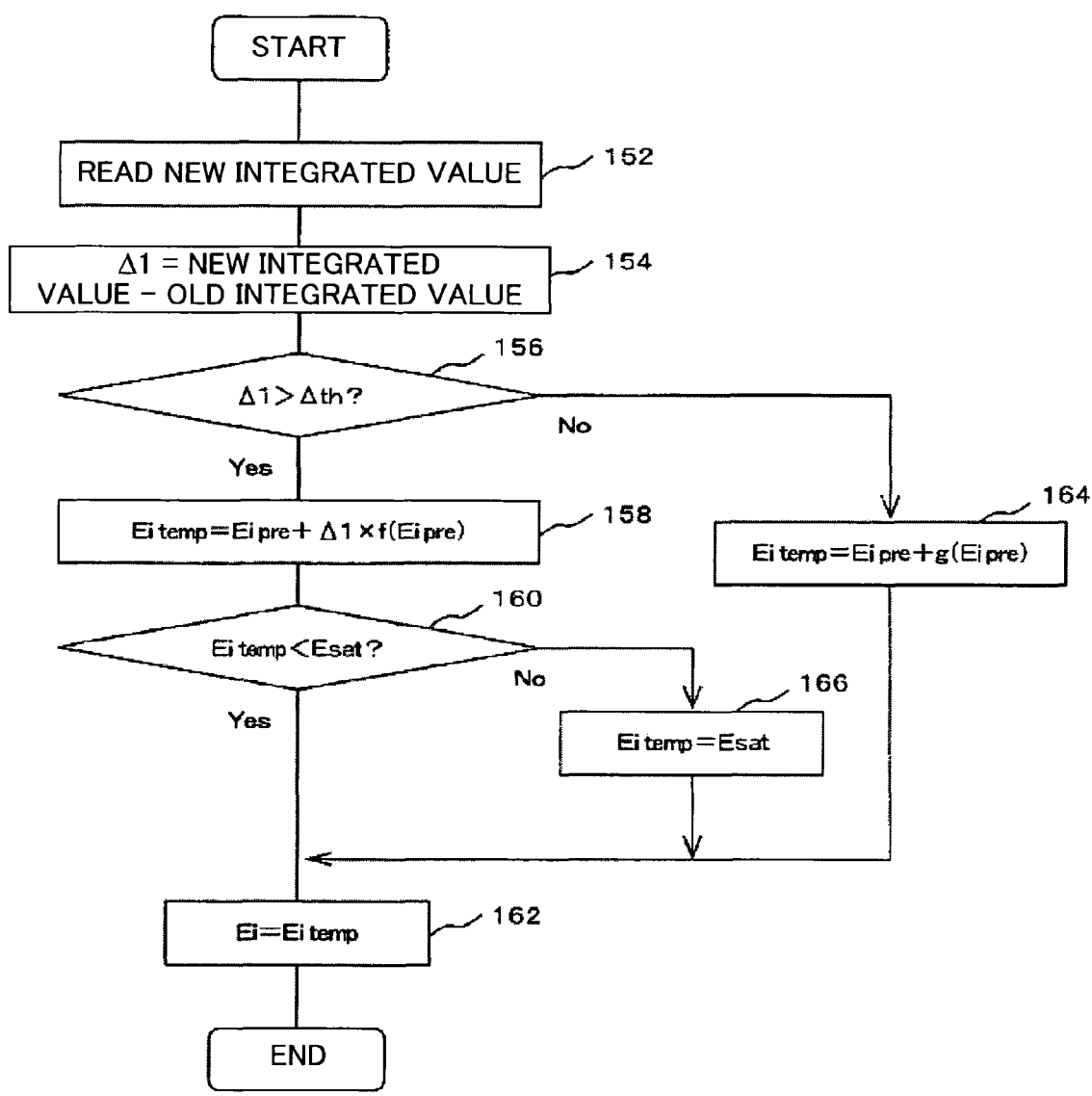
FIG. 6 shows a flow chart illustrating an example of the method for determining the integrated energy.
Figure 7:
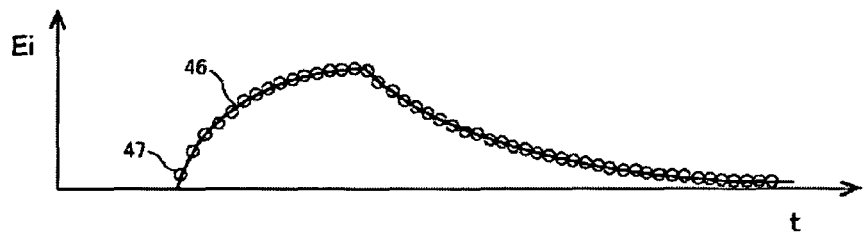
FIG. 7A shows an example of the change of the integrated energy.
FIG. 7B shows an example of the change of the pupil shape corresponding to FIG. 7A.

In Step 152 shown in FIG. 6, a second calculating unit included in the integrating unit 40 reads the new integrated value ΣPnew, which is the newest (latest) integrated value ΣP, from the first calculating unit. In this procedure, the integrated value ΣP, which has been used upon the previous calculation, is designated as the old integrated value ΣPold. If the calculation is performed for the first time at the present time, the old integrated value ΣPold is equal to the new integrated value ΣPnew. The calculation to be performed thereafter is conducted by the second calculating unit. Subsequently, in Step 154, the difference Δ1 (=ΣPnew−ΣPold) between the new integrated value ΣPnew and the old integrated value ΣPold is determined. Subsequently, in Step 156, it is judged whether or not the difference Δ1 is larger than a previously determined threshold value Δth. In order to neglect the integrated value increased by the light emission when the illumination light beam IL is emitted with a small power in order to measure, for example, the uneven illuminance, the threshold value Δth is set to be slightly larger than the integrated value to be increased by the light emission concerned.

If the difference Δ1 is larger than the threshold value Δth, then the operation proceeds to Step 158, and the temporary integrated energy Eitemp is calculated in accordance with the following expression by using the calculated value Eipre of the previous integrated energy Ei, the function f(Eipre) of the calculated value Eipre, and the difference Δ1.

$$\text{Eitemp} = \text{Eipre} + \Delta 1 \times f(\text{Eipre}) \quad (1)$$

The function f(Eipre) is defined, for example, as follows by using the saturated value Esat of the integrated energy Ei and the predetermined coefficients kh1, kh2.

$$f(\text{Eipre}) = kh1 \cdot (\text{Esat} - \text{Eipre})^{kh2} \quad (2)$$

Subsequently, in Step 160, Eitemp and Esat are compared with each other. If Eitemp is smaller than Esat, then the operation proceeds to Step 162, and Eitemp is designated as the present calculated value of the integrated energy Ei. In Step 160, if Eitemp is not less than Esat, then the operation proceeds to Step 166, the value of Eitemp is designated as Esat, and then the operation proceeds to Step 162. Therefore, the present calculated value of the integrated energy Ei is Esat.

On the other hand, in Step 156, if the difference Δ1 is not more than the threshold value Δth, then the operation proceeds to Step 164, and the temporary integrated energy Eitemp is calculated in accordance with the following expression by using the previous calculated value Eipre and the function g(Eipre) of the calculated value Eipre.

$$\text{Eitemp} = \text{Eipre} + g(\text{Eipre}) \quad (3)$$

The function g(Eipre) is defined, for example, as follows by using the saturated value Esat and the predetermined coefficients kc1, kc2. For example, exponential function etc. can be also used as the functions f and g.

$$g(\text{Eipre}) = kc1 \cdot \text{Eipre}^{kc2} \quad (4)$$

After that, the operation proceeds to Step 162, Eitemp calculated in Step 164 is designated as the present calculated value of the integrated energy Ei.

The calculation of the integrated energy Ei in Steps 152 to 162 is continuously executed at constant time intervals during the operation period of the exposure apparatus EX including the light emission period and the non-light emission period of the light source 10 shown in FIG. 1.

A curve 46 shown in FIG. 7A shows an example of the change of the integrated energy Ei calculated at constant time intervals in accordance with the operation shown in FIG. 6. With reference to FIG. 7A, the horizontal axis represents the elapsed time t, and the integrated energy is calculated at a series of calculation points 47 along the curve 46. The intervals between the calculation points are shown larger than the actual intervals. Assuming that the illumination condition is the annular illumination, it is assumed that the outer radius r2A of the pupil shape (annular area 51A) shown in FIG. 5A is the radius iNA of the pupil shape. On this assumption, the radius iNA of the pupil shape is changed as shown in FIG. 7B corresponding to the integrated energy Ei shown in FIG. 7A. With reference to FIG. 7B, the radius iNA is gradually increased from the initial value iNAt during the heating period in which the emission of the illumination light beam IL is started at the point in time t1 and the integrated energy Ei is increased. Further, when the emission of the illumination light beam IL is stopped at the point in time t2, and the cooling period is given, then the radius iNA is gradually decreased in accordance with the decrease in the integrated energy Ei. In this way, the amount of change of the integrated energy Ei and the amount of change of the radius iNA of the pupil shape are approximately in a proportional relationship.

Figure 8:
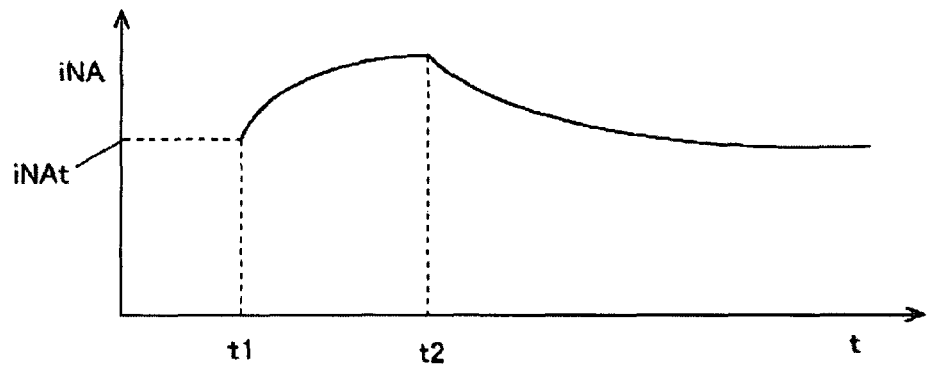
FIG. 8 shows an example of the angle correction table for the mirror element.

Accordingly, in this embodiment, for example, as shown in FIG. 8, the angle correction table is prepared before the start of the exposure of the wafer, in which the integrated energy Ei and one set of the setting values of driving signals (referred to as setting value BNF) are arranged corresponding to each other. The setting value BNF is the value for controlling the angles of inclination of all of the mirror elements 16 of SLM 14 about the orthogonal two axes to maintain the radius iNA of the pupil shape to be substantially the constant value. The angle correction table is stored in the storage device 33. With reference to FIG. 8, for example, the integrated energy Ei is classified into the first stage ranging from the saturated value Esat to the next level Eth1 (Eth1<Ei≤Esat), the second stage (Eth2<Ei≤Eth1) to the fourteenth stage (Eth14<Ei≤Eth13), and the fifteenth stage ranging from 0 to the level Eth14 (0≤Ei Eth14). For example, the boundary levels Eth14 to Eth1 are set at equal intervals between 0 and Esat.

When the integrated energy Ei is within the range of the kth stage (k=1 to 15), the setting value BNF of the driving signals for controlling the angles of inclination of all of the mirror elements 16 of SLM 14 is the one set of setting values designated as the setting value BNF(k−1) corresponding thereto respectively. The setting value BNF(k−1) is one set of the driving signals for each of the mirror elements 16 in order that the pupil shape is allowed to have the target shape, for example, when the integrated energy Ei is at the center of the kth stage. The setting value BNF, which is provided when the integrated energy Ei is at the first stage (Eth1<Ei≤Esat), is represented by BNForg. One set of driving signals of the setting value BNF(k−1) for the mirror element 16, which is provided when the integrated energy Ei is within the range of the kth stage (k=1 to 15), can be determined, for example, by allowing the actually measured value of the integrated energy Ei and the pupil shape measured by using the pupil monitor system 23 to correspond to one another. The angle correction table shown in FIG. 8 is individually prepared corresponding respectively to the pupil shape (for example, circular, annular, dipole, or four-pole or four-spot (quadruple) shape) as determined depending on the illumination condition.

Next, an explanation will be made with reference to a flow chart shown in FIG. 9 about an example of the exposure method including the illumination method using the exposure apparatus EX of this embodiment. The angle correction table shown in FIG. 8 is prepared at the initial stage of this operation. The operation is controlled by the main control system 35.

Figure 9:
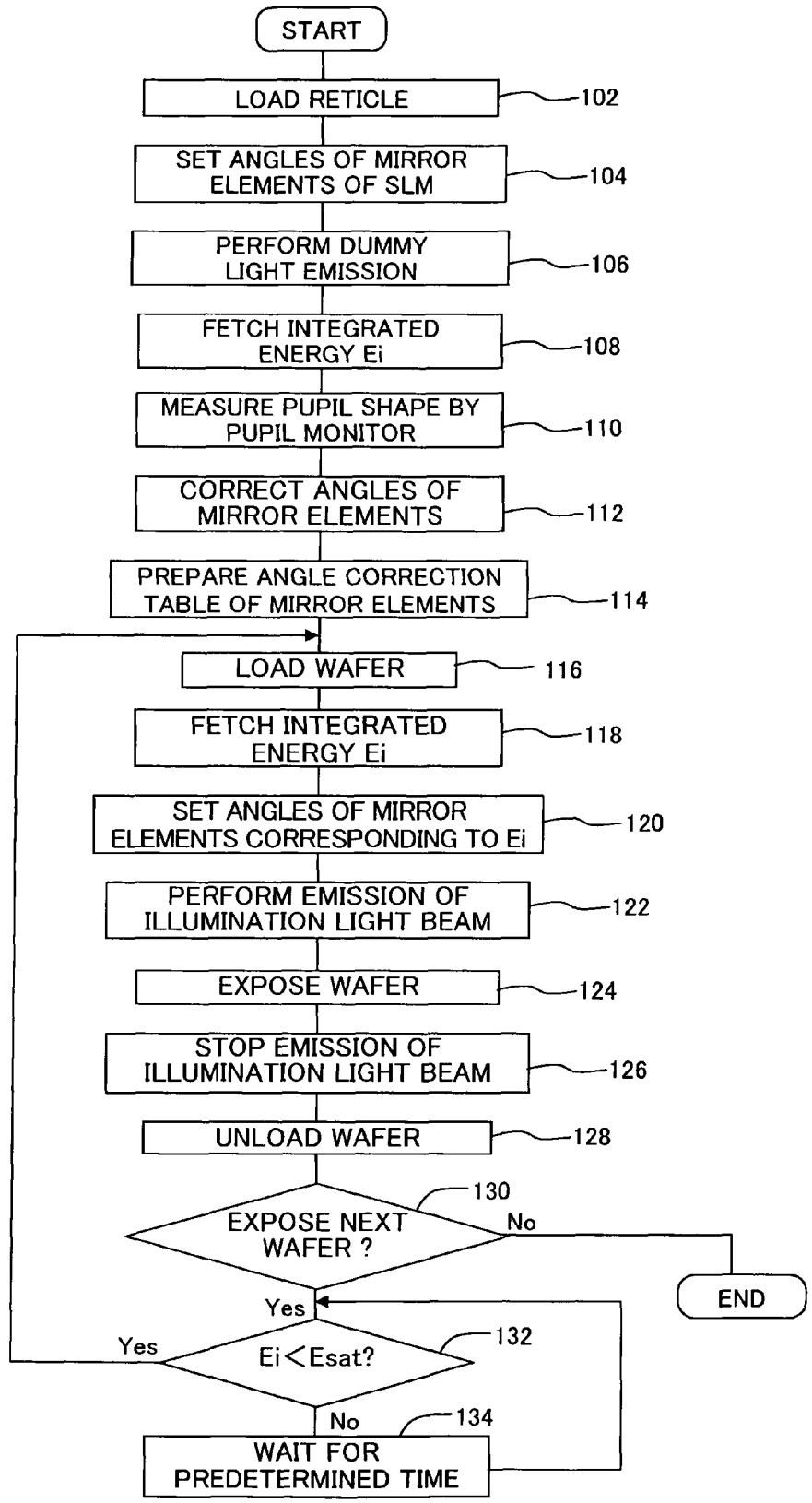
FIG. 9 shows a flow chart illustrating an example of the exposure method including the illumination method.

At first, in Step 102 shown in FIG. 9, the reticle R is loaded on the reticle stage RST shown in FIG. 1. Subsequently, in Step 104, the main control system 35 reads the information of the illumination condition of the reticle R, for example, from the exposure data file, and the information is outputted to the illumination control unit 36. The illumination control unit 36 sets, depending on the illumination condition, one set of the initial values of the angles of inclination of each of the mirror elements 16 of SLM 14 for the SLM control system 17. For example, assuming that the illumination condition is the annular illumination, the angles of inclination of the mirror elements 16 are set corresponding to the pupil shape shown in FIG. 5A. The SLM control system 17 sets the driving signal for each of the mirror elements 16 of SLM 14 in accordance with one set of the inclination angles. The information of the driving signal is also supplied to the illumination control unit 36. Accordingly, the angle of inclination (the angle) of each of the mirror elements 16 is set to the angle corresponding to the illumination condition.

Figure 10:
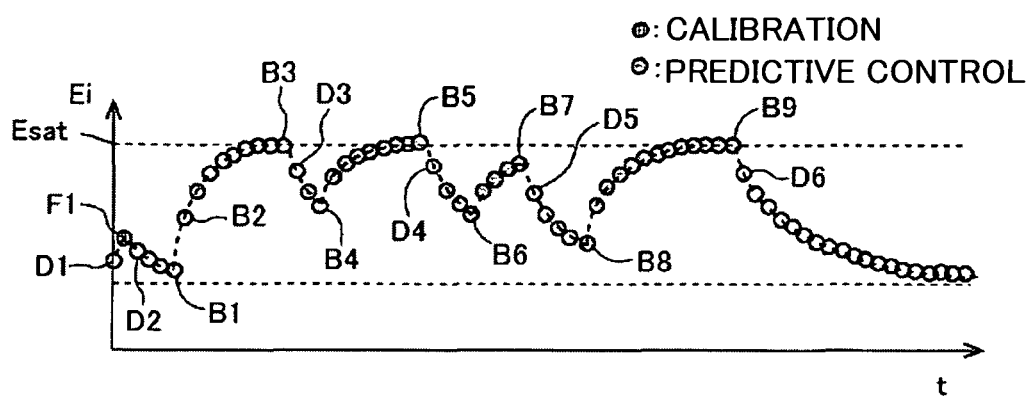
FIG. 10 shows an example of the switching sequence of the control method in the first embodiment.

Subsequently, in Step 106, the light source 10 is allowed to emit the illumination light beam IL (dummy light emission) in a state in which the wafer is not loaded on the wafer stage WST. Subsequently, in Step 108, the illumination control unit 36 fetches the integrated energy Ei from the integrating unit 40 connected to the integrator sensor 21. The integrated energy Ei, which is provided in this situation, has the value fetched at the sampling point F1 shown in FIG. 10. The horizontal axis shown in FIG. 10 is the elapsed time t. The sampling points D1, D2, . . . , D6 shown in FIG. 10 are the points at which the integrated energy Ei is fetched in a state in which the emission of the illumination light beam IL is stopped.

Subsequently, in Step S110, the shape of the light intensity distribution on the incident surface 25I, i.e., the pupil shape on the illumination pupil plane IPP is measured by the pupil monitor system 23, and the measured pupil shape is fetched by the illumination control unit 36. It is preferable that Steps 108 and 110 are executed substantially simultaneously.

Subsequently, in Step 112, the illumination control unit 36 corrects the angle of inclination of each of the mirror elements 16 of SLM 14 by using the pupil shape measured by using the pupil monitor system 23. For example, it is assumed that the integrated energy Ei, which is fetched in Step 108, is within the range of the eleventh stage (Eth11 to Eth10) of the angle correction table shown in FIG. 8. In this situation, the measured value of the radius iNA of the pupil shape is larger than the initial value iNAt shown in FIG. 7B.

Accordingly, the illumination control unit 36 calculates the correction amounts of the driving signals for all of the mirror elements 16 of SLM 14 so that the measured value of the radius iNA of the pupil shape is conformed to the initial value iNAt.

That is, the fluctuation amount (variation amount) from the initial value of the driving signal for each of the mirror elements 16 can be calculated from the measured value of the radius iNA of the pupil shape. Therefore, for example, the value, which is obtained by subtracting the fluctuation amount from the driving signal for each of the mirror elements 16, is designated as the setting value BNF10 of one set of the driving signals at the eleventh stage. Further, the illumination control unit 36 outputs the setting value BNF10 of the driving signal at the eleventh stage to the SLM control system 17. Corresponding thereto, the angle of inclination of each of the mirror elements 16 is corrected to the angle corresponding to the setting value BNF10.

Subsequently, in Step 114, the illumination control unit 36 determines the setting values BNForg to BNF9, BNF11 to BNF14 of the other stages in addition to the setting value BNF10 of the eleventh stage prepared in Step 112. Thus, the angle correction table shown in FIG. 8 is prepared. For example, it is assumed that the angle of inclination of each of the mirror elements 16 is changed approximately in proportion to the integrated energy Ei. The setting values BNForg to BNF9 and BNF11 to BNF14 are calculated in order that the radius iNA of each of the pupil shapes is set to the initial value iNAt when the integrated energy Ei is at the first stage to the tenth stage and the twelfth stage to the fifteenth stage other than the eleventh stage respectively, on the basis of the setting value BNF10. Each of setting values BNForg to BNF9 and BNF11 to BNF14 is one set of the driving signals for each of the mirror elements 16. The angle correction table shown in FIG. 8 prepared as described above is stored in the storage device 33.

In this procedure, for example, when the angle correction table has been prepared during previous exposure step, the calibration (calibration process) is performed for the angle correction table in Step 114.

Subsequently, in Step 116, for example, the wafer W coated with the photoresist, which is the first wafer of one lot, is loaded on the wafer stage WST. Subsequently, in Step 118, the illumination control unit 36 fetches the integrated energy Ei from the integrated unit 40. The integrated energy Ei has the value fetched at the sampling point B1 shown in FIG. 10. It is assumed that this value is, for example, within the range of the thirteenth stage shown in FIG. 8 (Eth13 to Eth12). Subsequently, in Step 120, the illumination control unit 36 reads the setting value BNF12 of the angle of inclination corresponding to the integrated energy Ei at the thirteenth stage in the angle correction table prepared in Step 114, and the setting value BNF12 is outputted to the SLM control system 17. The SLM control system 17 drives each of the mirror elements 16 of SLM 14 with the driving signals of the setting value BNF12. Accordingly, the angle of inclination of each of the mirror elements 16 is set so that the radius iNA of the pupil shape is maintained to the initial value iNAt.

In this procedure, the driving signals for setting the angles of inclination of the respective mirror elements 16 are corrected depending on the measured value of the integrated energy Ei. The above described correction of the driving signal for setting the angle of inclination of each of the mirror elements 16 depending on the integrated energy Ei, which is performed while regarding that the measured value of the integrated energy Ei indirectly represents the temperature of each of the mirror elements 16, is referred to as "predictive control" of the driving signal of each of the mirror elements 16.

Subsequently, in Step 122, the emission of the illumination light beam IL from the light source 10 is started. In Step 124, the respective shot areas of the wafer W are subjected to the scanning exposure with the image of the pattern of the reticle R in accordance with the step-and-scan system under the illumination light beam IL. Subsequently, the emission of the illumination light beam IL is stopped (Step 126), and the wafer W is unloaded (Step 128).

Subsequently, in Step 130, if any unexposed wafer remains, then the operation proceeds to Step 132, the integrated energy Ei is fetched, and it is judged whether or not the integrated energy Ei is smaller than the saturated value Esat. If the integrated energy Ei is smaller than the saturated value Esat, then the operation proceeds to Step 116, and the next wafer is loaded on the wafer stage WST. Subsequently, in Steps 118 and 120, the driving signal of each of the mirror elements 16 of SLM 14 is set to any setting value BNF(k−1) of the angle correction table shown in FIG. 8 in accordance with the predictive control by using the integrated energy Ei fetched at the sampling point B2 shown in FIG. 10. In Steps 122 to 128, the wafer is exposed. After that, the exposure is performed for a plurality of the following wafers by repeating Steps 116 to 128 until the sampling point B3 shown in FIG. 10.

After that, if the integrated energy Ei arrives at the saturated value Esat in Step 132, then the operation proceeds to Step 134, and the operation waits until the integrated energy Ei is lowered by a predetermined amount as compared with the saturated value Esat. After that, if the integrated energy Ei is smaller than the saturated value Esat, then the operation returns to Step 116, the angles of inclination of the respective mirror elements 16 of SLM 14 are set in accordance with the predictive control by using the integrated energy Ei fetched at the sampling point B4 shown in FIG. 10, and the wafer is exposed.

In the following procedure, the driving signals (angles of inclination) of the respective mirror elements 16 of SLM 14 are set in accordance with the predictive control on the basis of the integrated energy Ei respectively fetched at points ranging until the sampling point B5, points ranging from the sampling point B6 to the sampling point B7, and points ranging from the sampling point B8 to the sampling point B9, shown in FIG. 10, and the wafer is exposed. After that, if there is no unexposed wafer in Step 130, the exposure is completed for the wafer of one lot. The integrated energy Ei is gradually decreased in the cooling period after the sampling point D6 shown in FIG. 10.

According to the exposure method including this illumination method, the driving signal for each of the mirror elements 16 of SLM 14 is corrected so that the pupil shape is maintained to the target shape (shape corresponding to the illumination condition) on the basis of the measured value of the integrated energy Ei while regarding that the integrated energy Ei of the illumination light beam IL approximately corresponds to the average temperature of the respective mirror elements 16 of SLM 14. Therefore, even when the exposure is continued, and the temperatures of the respective mirror elements 16 are gradually changed, then the pupil shape on the illumination pupil plane IPP is always maintained approximately to the target shape. Therefore, the image of the pattern of the reticle R can be always exposed highly accurately on the respective shot areas of one lot of the wafer.

As described above, the illumination apparatus 8 of this embodiment is provided with the illumination optical system ILS, and the illumination apparatus 8 illuminates the reticle surface Ra with the illumination light beam IL allowed to come from the light source 10. Further, the illumination apparatus 8 is provided with SLM 14 which is arranged in the optical path for the illumination light beam IL and which has the plurality of mirror elements 16 which is possible to control the angle of reflection of the light beam allowed to come thereinto, the integrator sensor 21 and the integrating unit 40 which monitor the integrated energy of the illumination light beam IL, and the illumination control unit 36 which sets the driving signals (control amounts) for setting the angles of reflection of the incoming light beams allowed to come into the plurality of mirror elements 16 and which corrects the driving signals on the basis of the integrated energy fetched from the integrating unit 40.

The illumination method based on the use of the illumination apparatus 8 is the illumination method for illuminating the reticle surface Ra with the illumination light beam IL supplied from the light source 10. The illumination method comprises Step 104 of setting the driving signals to control the angle of reflection of the incident light for the plurality of mirror elements 16 of the SLM 14, Step 124 of illuminating the reticle surface Ra with the illumination light beam IL allowed to pass through the plurality of mirror elements 16, Step 118 of monitoring the integrated energy of the illumination light beam IL by the aid of the integrator sensor 21, and Step 120 of correcting the driving signals for the plurality of mirror elements 16 on the basis of the monitoring result of the integrated energy.

According to this embodiment, when the reticle surface Ra is illuminated by the aid of the plurality of mirror elements 16, the driving signals for the plurality of mirror elements 16 are corrected on the basis of the monitoring result of the integrated energy of the illumination light beam IL. In this procedure, the integrated energy indirectly represents the temperature information of the plurality of mirror elements 16. Therefore, even when the temperature of the mirror element 16 is changed, the angle of inclination of the mirror element 16 can be approximately maintained to the target angle of inclination. Therefore, the light intensity distribution of the illumination light beam IL can be maintained to be substantially constant on the incident surface 25I of the fly's eye lens 25 of the illumination optical system ILS. As a result, it is possible to suppress the fluctuation of the pupil shape on the illumination pupil plane IPP.

The exposure apparatus EX of this embodiment is the exposure apparatus for illuminating the pattern of the reticle R with the illumination light beam IL for the exposure and exposing the wafer W with the illumination light beam IL via the pattern and the projection optical system PL, wherein the exposure apparatus EX is provided with the illumination apparatus 8, and the illumination light beam allowed to come from the illumination apparatus 8 is used as the illumination light beam IL. According to this exposure apparatus EX, even when the exposure is continuously performed, the pupil shape is approximately maintained to the target shape. Therefore, the wafer W can be always exposed with the image of the pattern of the reticle R highly accurately.

In this embodiment, the pupil shape is measured by using the pupil monitor system 23 in Step 110. For example, when the pupil monitor 60 shown in FIG. 3 is provided on the side of the wafer stage WST, the pupil shape may be also measured by using the pupil monitor 60 in Step 110. In this procedure, it is possible to omit the pupil monitor system 23 in the illumination optical system ILS.

When the angle correction table is prepared in Step 114, it is also allowable to use the relationship between the temperature of the mirror element and the angle of inclination previously determined regarding the spatial light modulator singly, without using the pupil shape measured by the pupil monitor system 23 (or the pupil monitor 60).

Second Embodiment

Next, a second embodiment of the present teaching will be explained with reference to FIGS. 11 and 12. The exposure apparatus EX shown in FIG. 1 is also used in this embodiment. However, this embodiment differs from the first embodiment in that the pupil shape, which is principally measured substantially in real-time by the pupil monitor system 23, is used in order to suppress the fluctuation of the pupil shape caused by the temperature change of the mirror element 16 of SLM 14. An explanation will be made with reference to a flow chart shown in FIG. 11 about an example of the exposure method including the illumination method based on the use of the exposure apparatus EX of this embodiment. Steps in FIG. 11 corresponding to those of the flow chart shown in FIG. 9 are designated by the same reference numerals, any detailed explanation of which will be omitted. In FIG. 12, parts or components corresponding to those of FIG. 10 are designated by the same reference numerals, any explanation of which will be omitted. This operation is also controlled by the main control system 35.

Figure 11:
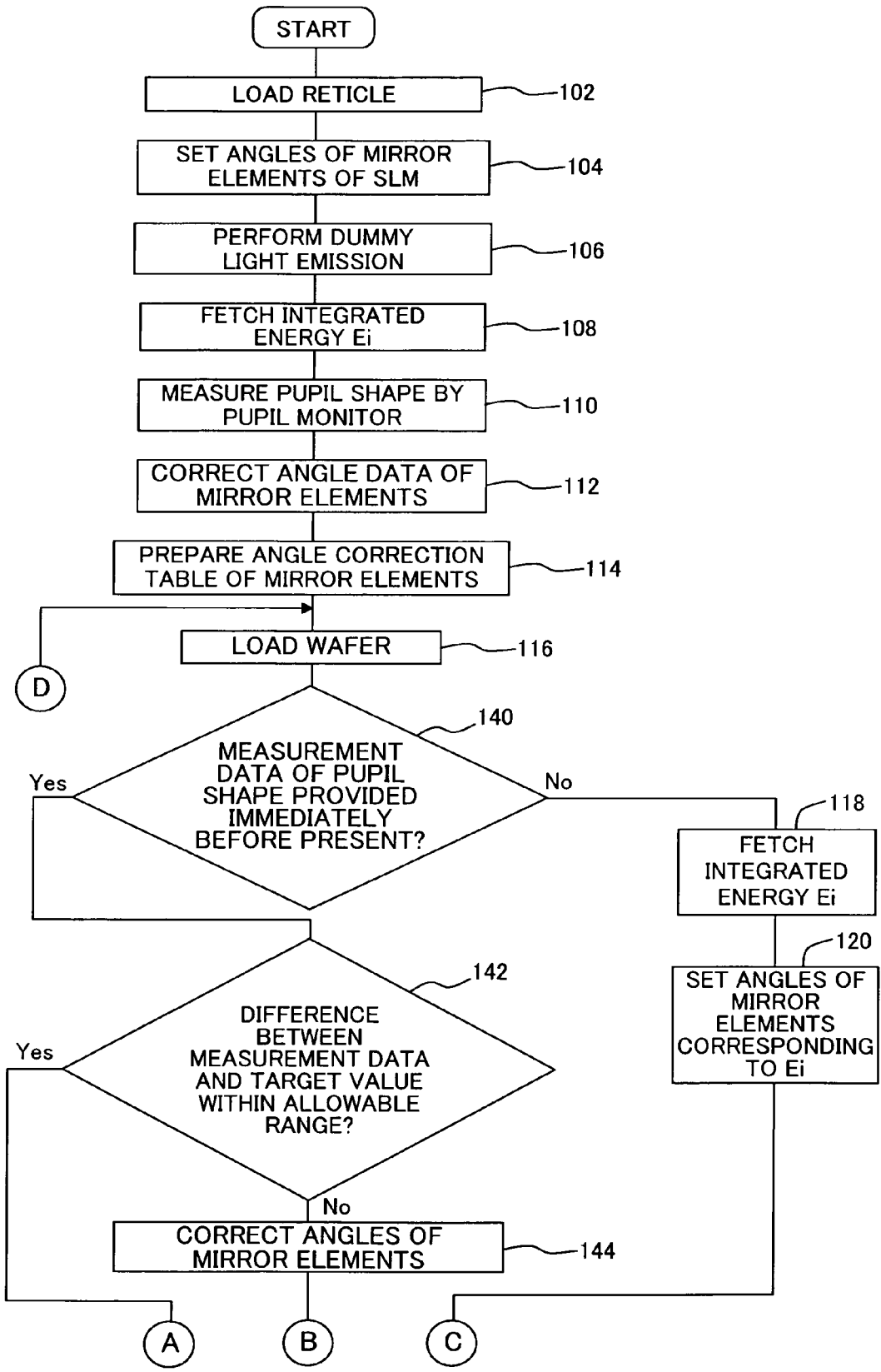
FIG. 11 shows a flow chart illustrating an example of the exposure method including the illumination method of a second embodiment.
Figure 12:
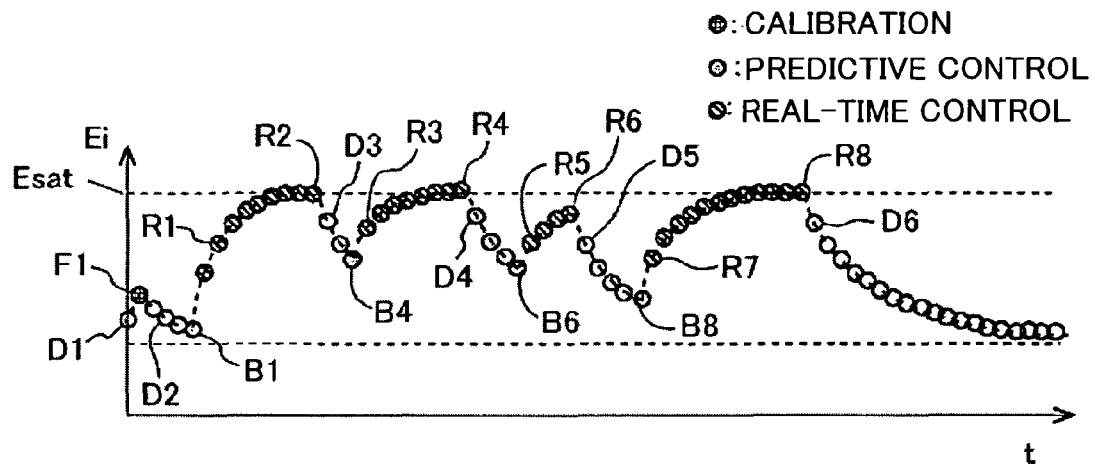
FIG. 12 shows an example of the switching sequence of the control method in the second embodiment.

At first, Steps 102 to 114 shown in FIG. 11 are executed, and the angle correction table shown in FIG. 8 is prepared. Subsequently, in Step 116, for example, the wafer W coated with the photoresist, which is the first wafer of one lot, is loaded on the wafer stage WST. Subsequently, in Step 140, it is judged whether or not the measurement data of the pupil shape measured by the pupil monitor system 23 immediately before is present. At this stage, the emission of the illumination light beam IL is stopped, and the measurement data is absent. Therefore, the operation proceeds to Step 118. The illumination control unit 36 fetches the integrated energy Ei from the integrating unit 40. This integrated energy Ei has the value fetched at the sampling point B1 shown in FIG. 12. Subsequently, in Step 120, the illumination control unit 36 reads, in the angle correction table prepared in Step 114, the setting value of the angle of inclination (any one of BNF) corresponding to the integrated energy Ei, and the setting value is outputted to the SLM control system 17. The SLM control system 17 drives the respective mirror elements 16 of SLM 14 with the driving signals of the setting value. In accordance with the predictive control, the driving signal for each of the mirror elements 16 is set so that the radius iNA of the pupil shape is maintained to the initial value iNAt.

After that, the operation proceeds to Step 122, and the emission of the illumination light beam IL is performed. Subsequently, the wafer W is exposed in Step 124. The light intensity distribution on the detection surface HP and consequently the pupil shape on the illumination pupil plane IPP are measured by the pupil monitor system 23 in Step 146 approximately concurrently with the exposure of the wafer W. Subsequently, the emission of the illumination light beam IL is stopped (Step 126), and the wafer W is unloaded (Step 128).

Subsequently, in Step 130, if any unexposed wafer remains, then the operation proceeds to Step 132, the integrated energy Ei is fetched, and it is judged whether or not the integrated energy Ei is smaller than the saturated value Esat. If the integrated energy Ei is smaller than the saturated value Esat, then the operation proceeds to Step 116, and the next wafer is loaded on the wafer stage WST. Subsequently, in Step 140, the measurement data of the pupil shape provided immediately before is present. Therefore, the operation proceeds to Step 142. This stage corresponds to the sampling point R1 shown in FIG. 12.

In Step 142, the illumination control unit 36 compares the pupil shape (measurement data) fetched from the pupil monitor system 23 with the target pupil shape, and it is judged whether or not the difference therebetween those pupil shapes (for example, the square sum of the differences in the light intensity) is within an allowable range. If the difference is within the allowable range, the operation proceeds to Step 122 to perform, for example, the emission of the illumination light beam IL and the exposure of the wafer W. On the other hand, if the difference between the pupil shape (measurement data) and the target pupil shape is not within the allowable range in Step 142, then the operation proceeds to Step 144, and the illumination control unit 36 corrects the angles of inclination of the respective mirror elements 16 by correcting the driving signals for the respective mirror elements 16 by the aid of the SLM control system 17 so that the pupil shape is coincident with the target shape. The correction of the driving signal of the mirror element 16, which is performed on the basis of the pupil shape measured by the pupil monitor system 23 substantially in real-time as described above, is referred to as "real-time control". After that, the operation proceeds to Step 122 to perform, for example, the emission of the illumination light beam IL and the exposure of the wafer W.

In the following operation, the wafer is exposed while setting (correcting) the driving signal (angle of inclination) of each of the mirror elements 16 of SLM 14 in accordance with the real-time control until the sampling point R2 shown in FIG. 12. At the sampling points B4, B6, B8 after the following cooling period, the driving signal (angle of inclination) of each of the mirror elements 16 of SLM 14 is set (corrected) in accordance with the predictive control by using the integrated energy Ei measured by the integrator sensor 21, and the wafer is exposed.

At the sampling points R3 to R4, R5 to R6, R7 to R8 subsequent to the sampling point B4 etc., the driving signal (angle of inclination) of each of the mirror elements 16 of SLM 14 is set (corrected) in accordance with the real-time control respectively, and the wafer is exposed. After that, if there is no unexposed wafer in Step 130, the exposure is completed for the wafer of one lot.

According to the exposure method including the above illumination method, if there is no preceding (last) measurement data of the pupil shape provided by the pupil monitor system 23 immediately before, the driving signal for each of the mirror elements 16 of SLM 14 is corrected in accordance with the predictive control on the basis of the integrated energy Ei of the illumination light beam IL. If there is any preceding (last) measurement data of the pupil shape provided by the pupil monitor system 23 immediately before, the driving signal for each of the mirror elements 16 of SLM 14 is corrected in accordance with the real-time control on the basis of the measurement data. Therefore, even when the exposure is continued, and the temperature of each of the mirror elements 16 is gradually changed, then the pupil shape on the illumination pupil plane IPP is always maintained approximately to the target shape. As a result, the respective shot areas of the wafer of one lot can be always exposed with the image of the pattern of the reticle R highly accurately.

In the respective embodiments described above, SLM 14, for which it is possible to control the angles of inclination of the plurality of mirror elements 16 about the orthogonal two axes, is used in order to set the light intensity distribution (light amount distribution) on the incident surface 251 or the illumination pupil plane IPP. However, the present teaching is also applicable to the case of use of a spatial light modulator having an array of a plurality of mirror elements for which the positions of respective reflecting surfaces in the normal line direction can be controlled, in place of SLM 14. Those usable as the spatial light modulator as described above include spatial light modulators disclosed, for example, in U.S. Pat. No. 5,312,513 and FIG. 1d of U.S. Pat. No. 6,885,493. In the case of the spatial light modulator as described above, the same or equivalent function as that of the diffraction surface can be applied to the incoming light beam by forming a two-dimensional height distribution. The spatial light modulator, which has the plurality of two-dimensionally arranged reflecting surfaces as described above, may be modified, for example, in accordance with the disclosure of U.S. Pat. No. 6,891,655 and United States Patent Application Publication No. 2005/0095749. Further, the present teaching is also applicable to the case of use of any light modulator provided with a plurality of optical elements for which, for example, the state of the incoming light (for example, angle of reflection, angle of refraction, and transmittance) can be controlled respectively, in place of SLM 14.

In the embodiment described above, the fly's eye lens 25 as shown in FIG. 1, which is the wavefront division type integrator, is used as the optical integrator. However, a rod type integrator as the internal surface reflection type optical integrator can be also used as the optical integrator.

In the embodiment described above, the projection optical system of the exposure apparatus is not limited to only the reduction system, which may be either the 1X magnification system or the magnification system. The projection optical system is not limited to only the refraction system, which may be either the reflection system or the catadioptric system. The projected image may be either the inverted image or the erecting image.

As disclosed, for example, in International Publication No. 2001/035168, the present teaching is applicable to an exposure apparatus (lithography system) for forming a line-and-space pattern on a wafer W by forming interference fringes on the wafer W.

Further, the present teaching is applicable to an exposure apparatus as disclosed, for example, in U.S. Pat. No. 6,611,316, in which two reticle patterns are combined on a wafer via a projection optical system, and one shot area on the wafer is subjected to the double exposure substantially simultaneously by means of the scanning exposure performed once.

The object (object as the exposure target irradiated with the energy beam), on which the pattern is to be formed in the embodiment described above, is not limited to the wafer. It is also allowable to use any other object including, for example, glass plate, ceramic substrate, film member, and mask blanks.

In the embodiment described above, it is also possible to apply the so-called polarization illumination method disclosed in U.S. Patent Application Publication No. 2006/0170901 and U.S. Patent Application Publication No. 2007/0146676.

In the embodiment described above, the present teaching is applied to the illumination optical system in which the mask (or the wafer) is illuminated in the exposure apparatus. However, there is no limitation thereto. The present teaching is also applicable to any general illumination optical system for illuminating any illumination objective surface other than the mask (or the wafer).

Figure 13:
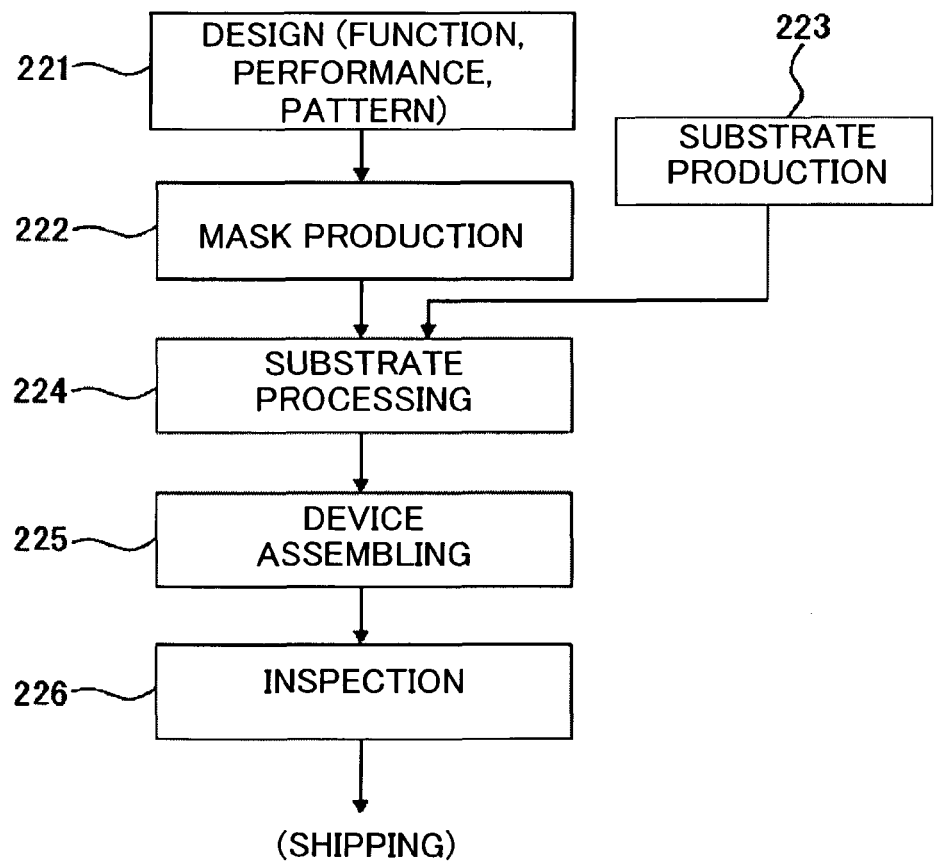
FIG. 13 shows a flow chart illustrating an example of the production method for producing an electronic device.

When an electronic device (microdevice) such as a semiconductor device or the like is produced by using the exposure apparatus EX or the exposure method of the embodiment described above, as shown in FIG. 13, the electronic device is produced by performing, for example, a step 221 of designing the function and the performance of the device, a step 222 of manufacturing a mask (reticle) based on the designing step, a step 223 of producing a substrate (wafer) as a base material of the device, a substrate-processing step 224 including, for example, a step of exposing the substrate with the pattern of the mask by means of the exposure apparatus EX or the exposure method of the embodiment described above, a step of developing the exposed substrate, and a step of heating (curing) and etching the developed substrate, a step 225 of assembling the device (including processing processes such as a dicing step, a bonding step, and a packaging step), and an inspection step 226.

In other words, the method for producing the device described above includes the step of exposing the substrate (wafer W) via the pattern of the mask by using the exposure apparatus EX or the exposure method of the embodiment described above, and the step of processing the exposed substrate (i.e., the developing step of developing the resist of the substrate to form the mask layer corresponding to the pattern of the mask on the surface of the substrate and the processing step of processing (for example, heating and etching) the surface of the substrate via the mask layer).

According to the above method for producing the device, the wafer can be always exposed with the image of the pattern of the reticle highly accurately by avoiding the fluctuation of the pupil shape of the exposure apparatus EX. Therefore, it is possible to produce the electronic device highly accurately.

The present teaching is also applicable to a liquid immersion type exposure apparatus disclosed, for example, in U.S. Patent Application Publication No. 2007/242247 or European Patent Application Publication No. 1420298. Further, the present teaching is also applicable to an illumination optical apparatus in which no condenser optical system is used. Further, the present teaching is also applicable to an exposure apparatus of the proximity type or the like in which no projection optical system is used.

The present teaching is not limited to the application of the production process for the semiconductor device. The present teaching is also widely applicable, for example, to the production processes for producing the liquid crystal display element, the plasma display and the like as well as the production processes for producing various devices (electronic devices) including, for example, the image pickup device (CMOS type, CCD and the like), the micro-machine, MEMS (Microelectromechanical Systems), the thin film magnetic head, and the DNA chip.

As described above, the present teaching is not limited to the embodiments described above, which may be embodied in other various forms without deviating from the gist or essential characteristics of the present teaching. The disclosures of the publications, the respective international publications, United States Patents, and United States Patent Application Publications described in this application are incorporated herein by reference.

The entire disclosure contents of U.S. patent application No. 61/493,759 filed on Jun. 6, 2010 including the specification, claims, drawings, and abstract are incorporated by reference in this application in their entireties.

While the particular aspects of embodiment(s) of the ILLUMINATION METHOD, ILLUMINATION OPTICAL DEVICE, AND EXPOSURE DEVICE described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the subject matter claimed are merely exemplary, illustrative and representative of the subject matter which is broadly contemplated by the claimed subject matter. The scope of the presently described and claimed aspects of embodiments fully encompasses other embodiments which may now be or may become obvious to those skilled in the art based on the teachings of the Specification. The scope of the present ILLUMINATION METHOD, ILLUMINATION OPTICAL DEVICE, AND EXPOSURE DEVICE is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the Specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act."

It will be understood also by those skilled in the art that, in fulfillment of the patent statutes of the United States, Applicant(s) has disclosed at least one enabling and working embodiment of each teaching recited in any respective claim appended to the Specification in the present application and perhaps in some cases only one. Applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be", "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, Applicant(s) has disclosed only a single enabling example of any such aspect/feature/element of an embodiment or of any embodiment of the subject matter of what is claimed. Unless expressly and specifically so stated in the present application or the prosecution of this application, that Applicant(s) believes that a particular aspect/feature/element of any disclosed embodiment or any particular disclosed embodiment of the subject matter of what is claimed, amounts to the one and only way to implement the subject matter of what is claimed or any aspect/feature/element recited in any such claim, Applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

According to the embodiments described above, when the illumination objective surface is illuminated via the plurality of optical elements. the control amount for the plurality of optical elements is corrected on the basis of the result of monitoring of the integrated energy of the light from the light source. In this procedure, the integrated energy indirectly represents the temperature information of the plurality of optical elements. Therefore, even when the temperatures of the optical elements are changed, it is possible to suppress the fluctuation of the light intensity distribution of the light allowed to come via the plurality of optical elements.

The invention claimed is:

1. An illumination method for illuminating an illumination objective surface by using a light from a light source, the illumination method comprising:
setting a control amount for controlling a plurality of optical elements, to control a state of an incident light coming into each of the plurality of optical elements, the plurality of optical elements being arranged in parallel and being capable of controlling the state of the incident light;
illuminating the illumination objective surface with the light from the light source via the plurality of optical elements;
monitoring time-integrated energy of the light from the light source; and
correcting the control amount for the plurality of optical elements based on a result of the monitoring of the time-integrated energy.

2. The illumination method according to claim 1, further comprising:
detecting an intensity distribution of the light coming via the plurality of optical elements on a plane different from the illumination objective surface or on a plane different from a plane conjugate with the illumination objective surface, wherein:
the correcting of the control amount for the plurality of optical elements includes correcting of the control amount based on the result of the monitoring of the time-integrated energy and a result of detection of the intensity distribution.

3. The illumination method according to claim 2, wherein the detection of the intensity distribution of the light coming via the plurality of optical elements includes detection of the intensity distribution of the light coming via the plurality of optical elements on a plane equivalent to a plane conjugate with an exit pupil of an optical system for guiding the light from the plurality of optical elements to the illumination objective surface or a plane in a vicinity of the plane equivalent to the plane conjugate with the exit pupil of the optical system.

4. The illumination method according to claim 1, further comprising:
determining a corresponding relationship between the time-integrated energy and an intensity distribution of the light coming via the plurality of optical elements on a detection plane, the detection plane being a plane different from the illumination objective surface or a plane different from a plane conjugate with the illumination objective surface; and
storing, as a control table, the time-integrated energy and a correction amount of the control amount for the plurality of optical elements in a state in which the time-integrated energy and the correction amount correspond to one another, based on the corresponding relationship, wherein:
the control table is used in a case that the control amount for the plurality of optical elements is corrected.

5. The illumination method according to claim 4, wherein:
the illumination objective surface is a pattern formation plane formed with a pattern to be transferred to a substrate held by a substrate stage; and
the intensity distribution is detected on a detection plane on a side of the substrate stage in a case that the corresponding relationship is determined.

6. The illumination method according to claim 1, wherein:
the optical element is a reflecting element having a reflecting surface for reflecting the incident light; and
the control amount for controlling the optical element to control the state of the incident light is a driving signal to set at least one of a position in a normal direction of the reflecting surface and an angle of inclination of the reflecting surface.

7. An illumination optical apparatus for illuminating an illumination objective surface by using a light from a light source, the illumination optical apparatus comprising:
a spatial light modulator which is arranged in an optical path for the light from the light source and which has a plurality of optical elements capable of controlling a state of an incident light coming into each of the plurality of optical elements;
a monitor unit which monitors time-integrated energy of the light from the light source; and
a control system which sets a control amount for controlling the plurality of optical elements, to control the state of the incident light, and which corrects the control amount based on the time-integrated energy monitored by the monitor unit.

8. The illumination optical apparatus according to claim 7, further comprising:
a detecting unit which detects an intensity distribution of the light coming via the plurality of optical elements on a plane different from the illumination objective surface or a plane different from a plane conjugate with the illumination objective surface, wherein:
the control system corrects the control amount based on the time-integrated energy monitored by the monitor unit and the intensity distribution detected by the detecting unit.

9. The illumination optical apparatus according to claim 8, wherein the detecting unit detects the intensity distribution of the light coming via the plurality of optical elements on a plane equivalent to a plane conjugate with an exit pupil of the illumination optical apparatus or a plane in a vicinity of the plane equivalent to the plane conjugate with the exit pupil of the illumination optical apparatus.

10. The illumination optical apparatus according to claim 8, wherein:
the illumination objective surface is a pattern formation plane formed with a pattern to be transferred to a substrate held by a substrate stage; and
the detecting unit is provided on the substrate stage.

11. The illumination optical apparatus according to claim 7, further comprising:
a storage unit which stores a control table in which the time-integrated energy and a correction amount of the control amount for the plurality of optical elements correspond to one another, wherein:
the control system uses the control table when the control amount for the plurality of optical elements is corrected.

12. The illumination optical apparatus according to claim 7, wherein:
the optical element is a reflecting element having a reflecting surface which reflects the incident light; and
the control amount for controlling the optical element to control the state of the incident light is a driving signal to set at least one of a position in a normal direction of the reflecting surface and an angle of inclination of the reflecting surface.

13. The illumination optical apparatus according to claim 7, wherein:
the spatial light modulator is a part of an optical system which forms the light intensity distribution at a predetermined position in an illumination optical path of the illumination optical apparatus; and the illumination optical apparatus further comprises a surface light source forming optical system which forms a surface light source having a light intensity distribution equivalent to the light intensity distribution from the light from the spatial light modulator.

14. An exposure apparatus for illuminating a pattern with an exposure light and exposing a substrate with the exposure light via the pattern and a projection optical system, the exposure apparatus comprising:

the illumination optical apparatus as defined in claim 7, wherein:

a light from the illumination optical apparatus is used as the exposure light.

15. A method for producing a device, comprising:

forming a pattern of a photosensitive layer on a substrate by using the exposure apparatus as defined in claim 14; and processing the substrate formed with the pattern.

16. An illumination method for illuminating an illumination objective surface by using a light from a light source, the illumination method comprising:

setting a posture control amount for a plurality of optical elements which are arranged in parallel and a posture of each of which is changeable;

measuring an energy of the light propagating from the light source to the illumination objective surface; and changing the posture control amount for the plurality of optical elements so as to reduce posture changes of the plurality of optical elements by using an information related to the measured energy of the light, wherein the measured energy of the light indirectly corresponds to an average temperature of the plurality of optical elements.

17. The illumination method according to claim 16, further comprising:

detecting an intensity distribution of one or more lights, which propagate in an illumination path from the plurality of optical elements to the illumination objective surface, on a plane different from the illumination objective surface or on a plane different from a plane conjugate with the illumination objective surface, wherein:

changing the posture control amount for the plurality of optical elements includes changing the posture control amount for the plurality of optical elements using the information related to the measured energy of the light and a result of detection of the intensity distribution.

18. The illumination method according to claim 17, wherein detecting the intensity distribution of the one or more lights includes detecting the intensity distribution of the one or more lights on an equivalent plane equivalent to a plane conjugate with an exit pupil of an optical system which guides the light from the plurality of optical elements to the illumination objective surface or a plane in a vicinity of the equivalent plane.

19. The illumination method according to claim 18, further comprising storing, as a control table, the information related to the measured energy of the light and the posture control amount for the plurality of optical elements in a state in which the information related to the measured energy of the light and the posture control amount correspond to one another.

20. The illumination method according to claim 17, further comprising determining a corresponding relationship between the information related to the measured energy of the light and the intensity distribution of the one or more lights on the plane different from the illumination objective surface or on the plane different from the plane conjugate with the illumination objective surface.

21. An exposure method for exposing an object with an exposure light including illuminating a predetermined pattern using the illumination method as defined in claim 16.

22. The exposure method according to claim 21, further comprising projecting an image of the predetermined pattern onto the object.

23. A method for producing a device, comprising:

forming a photosensitive layer on an object, forming a pattern of the photosensitive layer by using the exposure method as defined in claim 21 to expose the photosensitive layer; and processing the object formed with the pattern.

24. The illumination method according to claim 16, wherein the posture control amount is related to propagation direction of light from the optical element.

25. The illumination method according to claim 24, further comprising distributing light from the plurality of optical elements on an illumination pupil.

26. The illumination method according to claim 16, wherein the information related to the measured energy of the light represents a temperature of the plurality of optical elements affected by a light coming into the plurality of optical elements.

27. An illumination optical apparatus for illuminating an illumination objective surface by using a light from a light source, the illumination optical apparatus comprising:

a spatial light modulator having a plurality of optical elements which are arranged in parallel and a posture of each of which is changeable;

a sensor which measures an energy of the light propagating from the light source to the illumination objective surface; and a controller which controls the spatial light modulator, wherein the controller performs:

setting a posture control amount for the plurality of optical elements; and changing the posture control amount for the plurality of optical elements so as to reduce posture changes of the plurality of optical elements by using an information related to the measured energy of the light, and wherein the measured energy of the light indirectly corresponds to an average temperature of the plurality of optical elements.

28. The illumination optical apparatus according to claim 25, further comprising:

a photo detector which detects an intensity distribution of one or more lights, which propagate in an illumination path from the plurality of optical elements to the illumination objective surface, on a plane different from the illumination objective surface or a plane different from a plane conjugate with the illumination objective surface, wherein:

the controller changes the control amount for the plurality of optical elements using the information related to the measured energy of the light and a result of detection of the intensity distribution.

29. The illumination optical apparatus according to claim 28, wherein the photo detector detects the intensity distribution of the one or more lights on an equivalent plane equivalent to a plane conjugate with an exit pupil of an optical system which guides a light from the plurality of optical elements to the illumination objective surface, or a plane in a vicinity of the equivalent plane.

30. The illumination optical apparatus according to claim 29, wherein the controller determines a corresponding relationship between the information related to the measured energy of the light and the intensity distribution of the one or more lights.

31. The illumination optical apparatus according to claim 28, further comprising a memory which stores, as a control table, the information related to the measured energy of the light and the control amount for the plurality of optical elements in a state in which the information related to the measured energy of the light and the control amount correspond to one another.

32. An exposure apparatus for exposing an object with an exposure light comprising the illumination optical apparatus as defined in claim 27 for illuminating a predetermined pattern.

33. The exposure apparatus according to claim 32, further comprising a projection optical system which projects an image of the predetermined pattern onto the object.

34. The illumination optical apparatus according to claim 25, wherein the posture control amount is related to propagation direction of light from the optical element.

35. The illumination optical apparatus according to claim 34, further comprising an optical system which is arranged between the spatial light modulator and the illumination objective surface and which distributes light from the plurality of optical elements on an illumination pupil of the illumination optical apparatus.

36. The illumination apparatus according to claim 27, wherein the information related to the measured energy of the light represents a temperature of the plurality of optical elements affected by a light coming into the plurality of optical elements.

* * * * *

UNITED STATES PATENT AND TRADEMARK OFFICE
CERTIFICATE OF CORRECTION

PATENT NO. : 10,120,283 B2
APPLICATION NO. : 14/123876
DATED : November 6, 2018
INVENTOR(S) : Yasushi Mizuno It is certified that error appears in the above-identified patent and that said Letters Patent is hereby corrected as shown below:

In the Claims

In Claim 11 (Column 22, Line 47), change "7. further comprising:" to -- 7, further comprising: --.

In Claim 34 (Column 26, Line 5), change "25, wherein" to -- 27, wherein --.

Signed and Sealed this
Twelfth Day of February, 2019

Andrei Iancu
*Director of the United States Patent and Trademark Office*